United States Patent [19]
Kinoshita et al.

[11] Patent Number: 5,631,585
[45] Date of Patent: May 20, 1997

[54] WAVE-SHAPING CIRCUIT

[75] Inventors: Kenji Kinoshita, Kariya; Katsuhiko Shirai, Okazaki; Takashi Harada, Hekinan, all of Japan

[73] Assignee: Nippondenso Co., Ltd., Kariya, Japan

[21] Appl. No.: 512,649

[22] Filed: Aug. 8, 1995

[30] Foreign Application Priority Data

Sep. 5, 1994 [JP] Japan ................................. 6-211499

[51] Int. Cl.$^6$ .................................................. H03K 5/08
[52] U.S. Cl. ............................. 327/100; 327/37; 327/73; 327/205; 327/102; 327/551; 327/72
[58] Field of Search .................... 327/72, 70, 69, 327/100, 102, 551, 205, 206, 42, 113, 68, 43, 37, 180, 73

[56] References Cited

U.S. PATENT DOCUMENTS

| | | | |
|---|---|---|---|
| 4,449,061 | 5/1984 | Yasuda et al. | 327/37 |
| 4,902,970 | 2/1990 | Suquet | 327/100 |
| 5,357,147 | 10/1994 | Ina et al. | 327/72 |

FOREIGN PATENT DOCUMENTS

| | | |
|---|---|---|
| 58-30671 | 2/1983 | Japan. |
| 60-231112 | 11/1985 | Japan. |

*Primary Examiner*—Timothy P. Callahan
*Assistant Examiner*—Dinh T. Le
*Attorney, Agent, or Firm*—Cushman, Darby & Cushman IP Group of Pillsbury Madison & Sutro LLP

[57] ABSTRACT

A wave-shaping circuit comprises a dynamic hysteresis generating circuit for generating a dynamic hysteresis voltage having a certain crest value and whose signal level attenuates at a speed proportional to a number of engine revolutions to mask an ignition noise superimposed on an input signal, and a threshold generating circuit for generating a threshold voltage whose signal level increases/decreases in proportion to the number of engine revolutions to mask an interference noise superimposed on the input signal and to reliably detect a minimum level of the input signal. Either the dynamic hysteresis voltage or the threshold voltage, whichever is higher, is selectively output as a comparison reference signal through a high-level selecting circuit.

8 Claims, 16 Drawing Sheets

LOW REVOLUTION

HIGH REVOLUTION

FIG.6A
FIG.6B
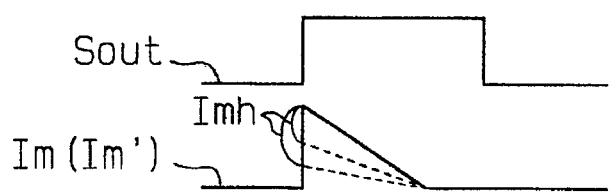
FIG.7A
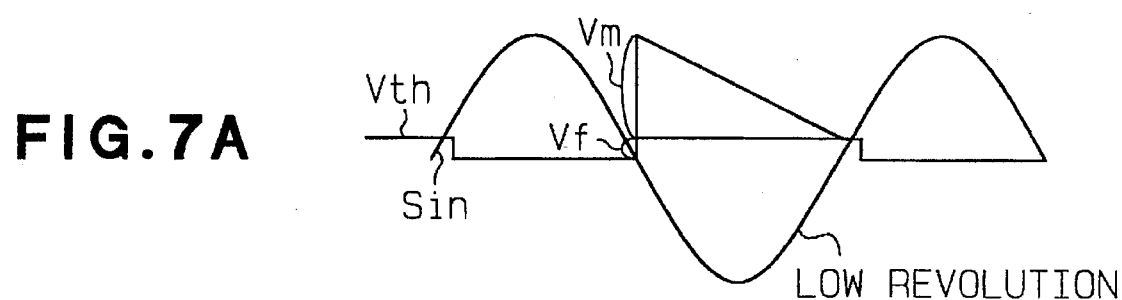
FIG.7B
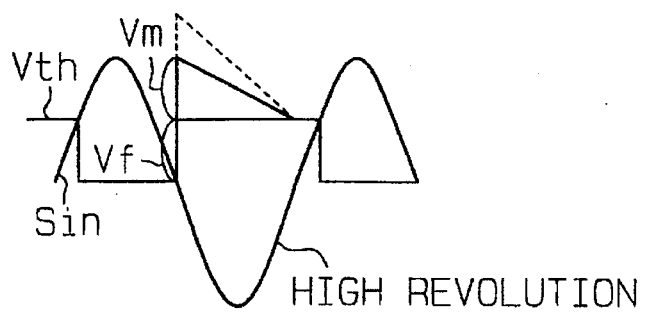
FIG.8A
FIG.8B
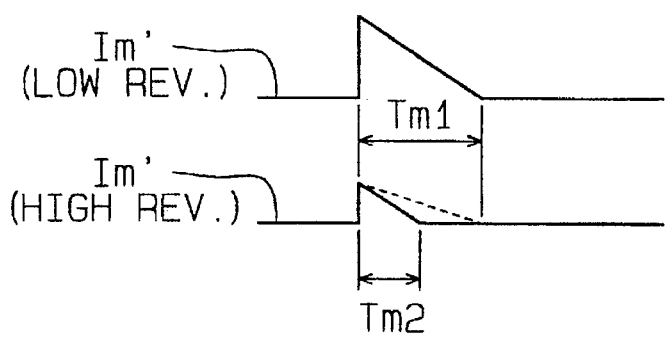

FIG.17A
PRIOR ART
FIG.17B
PRIOR ART
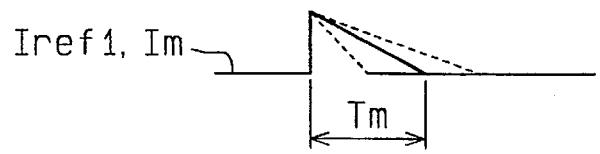
FIG.18A
PRIOR ART
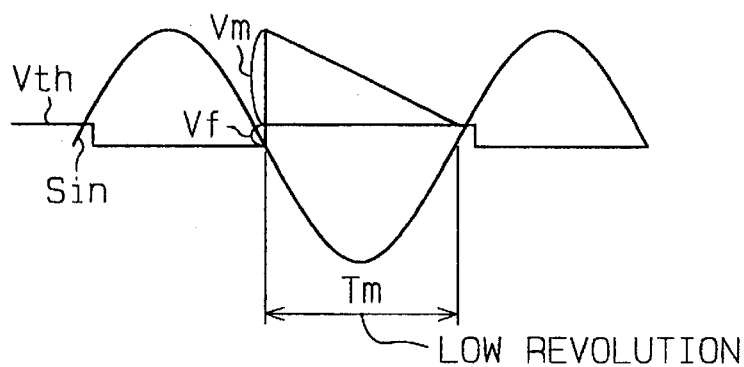
FIG.18B
PRIOR ART
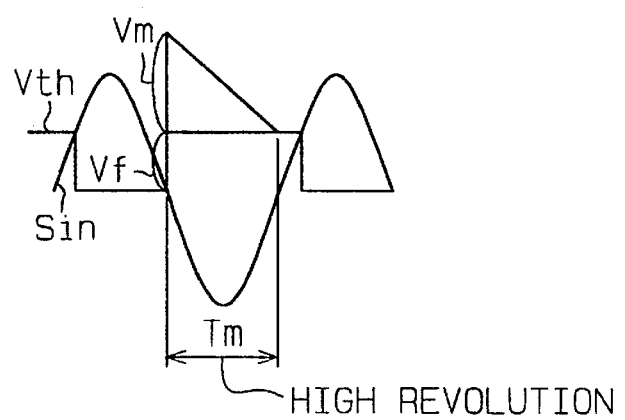

FIG.19 PRIOR ART
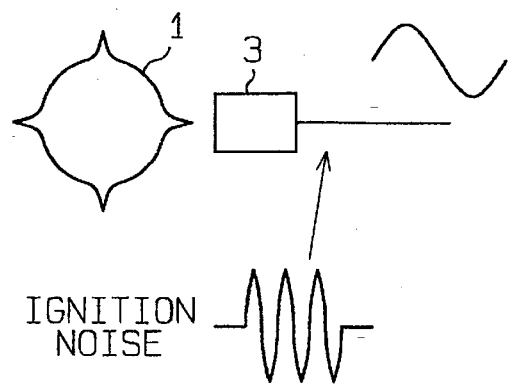
IGNITION NOISE
FIG.20A PRIOR ART
FIG.20B PRIOR ART
FIG.20C PRIOR ART
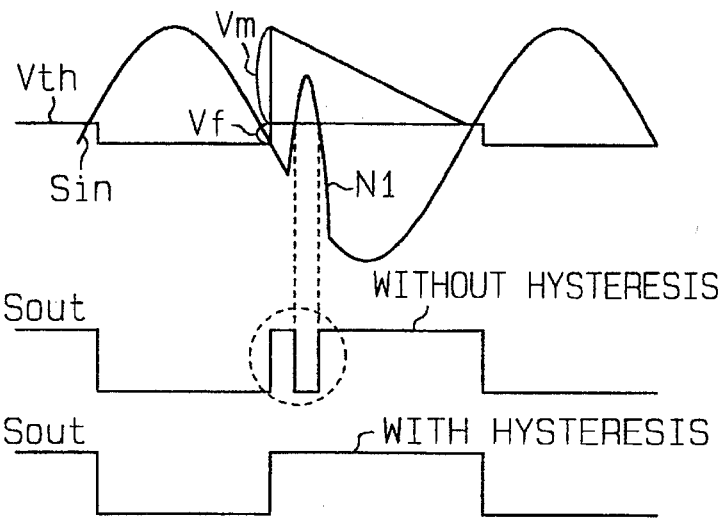

5,631,585

WAVE-SHAPING CIRCUIT

CROSS REFERENCE TO RELATED APPLICATION

This application is based on and claims priority of Japanese Application No. 6-211499 filed on Sep. 5, 1994, the content of which is incorporated herein by reference.

BACKGROUND OF THE INVENTION

1. Field of the Invention

The present invention relates to a wave-shaping circuit for arbitrarily wave-shaping and outputting an input analog signal more particularly, it relates to an improvement of a circuit for wave-shaping a signal outputted as an alternating analog signal, such as a crank angle signal sampled through an electromagnetic pickup to monitor a number of engine revolutions, into a binary signal which accurately corresponds with the alternating period of the analog signal, such a wave-shaping circuit is useful in an electronic control system of an engine mounted in a vehicle or the like.

2. Description of Related Art

An electronic control system of an engine is known in the art as shown in FIG. 12.

In FIG. 12, a signal rotor 1 rotates in synchronism with a cam shaft of a four-cylinder engine. As shown in the figure, the signal rotor 1 has four projections 2a, 2b, 2c and 2d for detecting a crank angle at regular intervals per 90° (180° CA (cam shaft angle)) on the outer periphery thereof. Those projections 2a, 2b, 2c and 2d are formed as conical projections made from an appropriate magnetic substance.

An electromagnetic pickup 3 is disposed in the vicinity of the signal rotor 1 to detect passages of the projections 2a, 2b, 2c and 2d as the signal rotor 1 rotates. This electromagnetic pickup 3 is constructed by winding a coil (not shown) around a core (not shown) made from an appropriate magnetic substance.

A wave-shaping circuit 4 wave-shapes an alternating analog signal induced by the electromagnetic pickup 3 as the signal rotor 1 having the projections 2a, 2b, 2c and 2d rotates into a binary signal which corresponds to an alternating period of the alternating analog signal. Normally the circuit 4 wave-shapes such alternating analog signal by comparing with a comparison reference signal by a comparator. The signal wave-shaped into the binary signal is inputted a microcomputer (CPU) 5.

An A/D converter 6 is a circuit for converting analog signals which correspond respectively with an "engine water temperature" and a "battery voltage" input through other sensors (not shown) disposed at various parts of the engine into digital signals. Those analog signals are converted into the digital signals on the basis of an A/D conversion command issued from the microcomputer (CPU) 5 together with a specification of a conversion channel thereof (specification of the analog signal to be inputted to) and the result of the A/D conversion is inputted to the microcomputer (CPU) 5.

An input buffer 7 is a circuit to which so-called ON/OFF signals such as an "electric load signal", "idle signal" and "starter signal" are input to adjust those signals to adequate signal levels for the microcomputer (CPU) 5 to process. Those signals whose levels have been adjusted are also inputted to the microcomputer (CPU) 5 from time to time.

The microcomputer (CPU) 5 calculates a number of revolutions or rotations of the signal rotor 1, i.e., a number of engine revolutions, on the basis of the binary period of the signal wave-shaped through the wave-shaping circuit 4 and processes the various signals taken in through the A/D converter 6 and the input buffer 7, as necessary. Then, it outputs an injection signal and an ignition signal, respectively, for a fuel injection apparatus (not shown) and an ignition apparatus (not shown) so as to realize a preferable engine control corresponding to an engine condition at each time.

In order to decide controlled variables and control timing appropriately at each time in such engine electronic control system, it is necessary for the microcomputer (CPU) 5 itself to grasp at least the number of engine revolutions correctly. Then, for that end, it becomes essential to wave-shape the alternating analog signal induced by the electromagnetic pickup 3 into the binary signal which accurately corresponds to the alternating period.

However, the binary signal is not necessarily wave-shaped accurately corresponding to the alternating period of the analog signal because noise in the vehicle such as ignition noise is often superimposed on the induced alternating analog signal and such superimposed noise component disturbs the binary output of the comparator in the wave-shaping circuit 4. When the signal is not wave-shaped accurately, the number of engine revolutions calculated through the microcomputer (CPU) 5 becomes inaccurate, and as a result, the reliability of the electronic control system is greatly damaged.

A circuit shown in FIG. 13 is used as the wave-shaping circuit 4 to deal with such a problem in the past. In the wave-shaping circuit shown in FIG. 13, the alternating analog signal induced by the electromagnetic pickup 3 is input to an input terminal 41. The alternating analog signal input to the input terminal 41 is applied to an inverting input (−terminal) of a comparator 42 as a signal Sin. A comparison reference signal Vth is applied to a non-inverting input (+terminal) of the comparator 42. An output terminal 43 is a terminal for outputting a wave-shaped signal Sout wave-shaped by the comparator 42 to the microcomputer (CPU) 5.

In the wave-shaping circuit 4, a F/V (frequency to voltage) converting circuit 44, a dynamic hysteresis generating circuit 45, a first threshold generating circuit 46 and a second threshold generating circuit 47 are circuits for generating the comparison reference signal Vth applied to the non-inverting input (+terminal) of the comparator 42.

Among them, the F/V converting circuit 44 receives the wave-shaped signal Sout output from the comparator 42 to output a voltage converting signal Vfv which corresponds to the frequency of the signal Sout, i.e. the number of engine revolutions. The voltage converting signal Vfv is applied respectively to the dynamic hysteresis generating circuit 45 and the first threshold generating circuit 46.

The dynamic hysteresis generating circuit 45 generates a dynamic hysteresis current Im having a predetermined crest value and whose level attenuates at a speed proportional to a voltage value of the voltage converting signal Vfv output from the F/V converting circuit 44. FIG. 14 shows one example of the dynamic hysteresis generating circuit 45.

In the dynamic hysteresis generating circuit 45 shown in FIG. 14, a transistor Q11 turns on when the wave-shaped signal Sout output from the comparator 42 turns to a logic-L (low) level and a transistor Q12 turns on when the wave-shaped signal Sout turns to a logic-H (high) level. When the transistor Q11 turns on, a capacitor 451 having a capacitance Cm is started to be charged and when the transistor Q12 turns on, this electric charge is started to be discharged.

During the discharge, the discharge current Inm flows into a discharge control circuit 452 via the transistor Q12, wherein the amount of discharge is controlled on the basis of the voltage converting signal Vfv output from the F/V converting circuit 44.

The discharge control circuit 452 comprises, as shown in FIG. 15 for example, a constant-current source 4521, a resistor 4522, diodes 4523 and 4524 for adding voltages, a non-inverting amplifier 4525, a transistor 4526, a load resistor 4527 and a feedback diode 4528.

In the discharge control circuit 452, a constant-voltage Ic×Rc which is defined by the above-mentioned constant-current source 4521 and the resistor 4522 is applied to the load resistor 4527 until when the voltage converting signal Vfv reaches a voltage which corresponds to 150 rpm as shown in FIG. 16 for example. That is, in this case, the discharge current Inm described above becomes a constant current expressed as follows:

$$Inm=Ic \times Rc/Rt$$

However, when the voltage converting signal Vfv exceeds the voltage which corresponds to 150 rpm of number for example, the voltage value of the voltage converting signal Vfv becomes dominant in the voltage applied to the load resistor 4527 and thereafter, the amount of the discharge current Inm also increases in proportion to the voltage value of the voltage converting signal Vfv as shown in FIG. 16 in a manner expressed as follows:

$$Inm=Vfv/Rt$$

That is, the discharge speed increases in proportion to the voltage value of the voltage converting signal Vfv.

In the dynamic hysteresis generating circuit 45 shown in FIG. 14, a transistor Q13 amplifies a capacitor voltage Vnm of the capacitor 451 and transistors Q14, Q15 and Q16 compose a base-current correcting current mirror circuit.

Accordingly, if a current Iref1 flows through a collector of the transistor Q13 as the voltage Vnm is amplified by the transistor Q13, a current Im equivalent to the current Iref1 starts to flow through a collector of the transistor Q16. Then, as shown in FIG. 17B, the level of those currents Iref1 and Im gradually attenuates or decreases from a certain crest value as the current Inm is discharged when the wave-shaped signal Sout shown in FIG. 17A is at the logic-H level. A mask time Tm accompanying this level of attenuation becomes shorter in proportion to the discharge speed of the discharge current Inm, i.e., in proportion to the number of engine revolutions. When the wave-shaped signal Sout turns to the logic-L level, a transistor Q17 turns on through an inverter 453, inhibiting the current Im from flowing out.

FIGS. 18A and 18B show voltage waveforms of a dynamic hysteresis voltage Vm formed by the current (dynamic hysteresis current) Im and a resistor 51 (shown in FIGS. 13 and 14). As shown in FIGS. 18A and 18B, this dynamic hysteresis voltage Vm also has the following characteristics:

a) its crest value is held at a constant value even if the number of engine revolutions changes; and b) the higher the number of engine revolutions, the shorter the mask time Tm becomes. A voltage Vf is a threshold voltage which is generated through the first threshold generating circuit 46 described below. A voltage to which the dynamic hysteresis voltage Vm and threshold voltage Vf are added becomes the comparison reference signal Vth described above.

The dynamic hysteresis voltage Vm is a voltage for masking a noise N1 when it is superimposed on an input signal (output of the electromagnetic pickup 3) Sin in a manner as shown in FIG. 20A by ignition noise shown in FIG. 19.

That is, while the wave-shaped signal Sout is output in a way of inviting an erroneous operation of the microcomputer 5 as shown in FIGS. 20A and 20B when no component of the dynamic hysteresis voltage Vm exists for the comparison reference signal Vth, the noise N1 is appropriately masked when the dynamic hysteresis voltage Vm exists as shown in FIGS. 20A and 20C, allowing an accurate wave-shaped signal Sout to be obtained.

In the wave-shaping circuit 4 shown in FIG. 13, the first threshold generating circuit 46 generates a threshold current If whose level increases and decreases in proportion to the voltage value of the voltage converting signal Vfv output from the F/V converting circuit 44. FIG. 21 shows one example of the circuit 46.

In the first threshold generating circuit 46 shown in FIG. 21, a transistor Q21 amplifies the voltage converting signal Vfv output from the F/V converting circuit 44 and transistors Q22, Q23 and Q24 compose a base-current correcting current mirror circuit.

Accordingly, if a current Iref2 flows through a collector of the transistor Q21 as the voltage converting signal Vfv is amplified by the transistor Q21, a current If equivalent to the current Iref2 flows through a collector of the transistor Q24. However, when this current If is below a certain current value, i.e., when the voltage converting signal Vfv takes a small value which is below a certain number of engine revolutions, the current If is absorbed by a constant-current source 461 (If=0) and the threshold voltage Vf generated through the current If becomes constant at a partial potential value (minimum value) of a potential dividing circuit comprising the resistors 50 and 51.

A transistor Q26 turns on when the voltage converting signal Vfv is above a partial potential value of a potential dividing circuit comprising resistors 462 and 463. Accordingly, when the voltage converting signal Vfv becomes above that partial potential value, i.e., when the number of engine revolutions becomes above the certain number of revolutions, the current If becomes constant at a current value (maximum value) defined by the partial potential value of the potential dividing circuit comprising the resistors 462 and 463 and the threshold voltage Vf also becomes constant at a value which corresponds to the maximum value of the current If.

After all, the level of the threshold current If output from the first threshold generating circuit 46 increases and decreases in a manner as shown in FIGS. 22A and 22B between the minimum and maximum values in proportion to the magnitude of the voltage converting signal Vfv, i.e., the number of engine revolutions, when the wave-shaped signal Sout is on the logic-H level. When the wave-shaped signal Sout turns to the logic-L level, a transistor Q25 turns on via an inverter 464, inhibiting the current If from flowing out.

FIG. 23 shows one example of a relationship between the threshold voltage Vf generated on the basis of the threshold current If and the number of engine revolutions (magnitude of the voltage converting signal Vfv).

As shown in the figure, the threshold voltage Vf takes a minimum value A1 when the number of engine revolutions is below 50 rpm for example and takes a maximum value A3 when the number of engine revolutions is above 2000 rpm. A value A2 therebetween increases and decreases in proportion to the number of engine revolutions. The lower limit value A1 of the threshold voltage Vf is normally set at a level on which no interference noise N2 superimposed in a manner as shown in FIG. 25 for example is detected when a plurality of electromagnetic pickups 3 and 3' are closely disposed as shown in FIG. 24 for example. FIG. 23 shows an area where this interference noise N2 or the like cannot be masked as an area B. On the other hand, the upper limit value A3 of the threshold voltage Vf is set at a level on which even a minimum output voltage of the electromagnetic pickup 3 can be detected. FIG. 23 shows an area where the minimum output voltage of the electromagnetic pickup 3 cannot be detected as an area C.

In the wave-shaping circuit 4 shown in FIG. 13, the second threshold generating circuit 47 generates the comparison reference signal Vth when the wave-shaped signal Sout is at the logic-L level.

That is, as shown in FIG. 13, when the wave-shaped signal Sout is on the logic-L level, a transistor 472 turns on through an inverter 471 in the second threshold generating circuit 47. Then, as the transistor 472 turns on, a potential dividing circuit comprising a resistor 473 in addition to the resistors 50 and 51 is formed and the comparison reference signal Vth is fixed by a partial potential value of the potential dividing circuit. This comparison reference signal Vth is used as a binary threshold voltage when the aforementioned alternating input signal Sin is at the positive side.

The wave-shaping circuit described above thus waveshapes (binarizes) the input signal Sin in the condition wherein such noise component is well masked no matter when the ignition noise is superimposed or the interference noise between the pickups is superimposed on the input signal Sin.

However, because the wave-shaping circuit is arranged so as to form the comparison reference signal Vth by simply adding the dynamic hysteresis voltage Vm and the threshold voltage Vf described above through the diodes 48 and 49 when the wave-shaped signal Sout is at the logic-H level, it also has the following problem.

That is, as shown in FIGS. 26A and 26B, the level of the comparison reference signal Vth is maintained almost at the appropriate signal level even when the dynamic hysteresis voltage Vm and the threshold voltage Vf are added when the number of engine revolutions is relatively low. However, when the number of engine revolutions is high, the level of the comparison reference signal Vth is sufficiently raised and an accurate wave-shaping is not necessarily maintained, failing to detect the minimum output voltage of the electromagnetic pickup 3 for example (marked by a broken line A3' in FIG. 23).

As described before that, when it cannot correctly detect even the minimum output voltage of the electromagnetic pickup 3, the number of engine revolutions calculated through the microcomputer (CPU) 5 naturally takes an erroneous value, greatly damaging the reliability of the electronic control system.

SUMMARY OF THE INVENTION

Accordingly, it is an object of the present invention to solve the aforementioned problem by providing a waveshaping circuit which sets a comparison reference signal always at an appropriate level and to realize a high precision binarization process at any time.

According to the present invention, a wave-shaping circuit comprises, besides comparison reference signal generating means for dynamically generating a comparison reference signal as a combined signal of generated masking signals, comparison reference level limiting means to limit a signal level of the comparison reference signal so that it will not exceed a predetermined level, so that no excessive level of comparison reference signal is applied to a comparator. Due to, conditions that (1) various noises superimposed on an input signal are masked and (2) a minimum level of the input signal is reliably detected may be both satisfied even when the engine rotates at high-speed or when an alternating analog signal synchronized with the rotation of the engine is sampled using an electromagnetic pickup.

Preferably, masking signal generating means of the waveshaping circuit comprises dynamic hysteresis voltage generating means for generating a dynamic hysteresis voltage having a certain crest value and whose signal level attenuates at a speed proportional to a voltage value of the voltage converting signal output from frequency/voltage converting means and threshold voltage generating means for generating a threshold voltage whose signal level increases/ decreases in proportion to the voltage value of the voltage converting signal output from the frequency/voltage converting means, so that an ignition noise of the engine and an interference noise between pickups described above as the various noises may be assuredly masked even when those noises are superimposed on the input signal and the minimum level of the input signal may be reliably detected.

In the case that the masking signal generating means comprises the dynamic hysteresis generating means and the threshold generating means, the comparison reference level limiting means is arranged so as to selectively output either the dynamic hysteresis voltage or the threshold voltage, whichever has a higher, as the comparison reference signal, so that the action and effect described above may be obtained while effectively utilizing each characteristic of the dynamic hysteresis voltage and the threshold voltage as masking voltages.

The ignition noise is dominant as the noise component superimposed on the input signal in the beginning of the generation of the comparison reference signal when the dynamic hysteresis voltage is selectively output as the comparison reference signal. The interference noise becomes dominant as the noise component superimposed on the input signal in the period thereafter when the threshold voltage is selectively output as the comparison reference signal.

Preferably, the comparison reference level limiting means is arranged so as to control the level of at least either the dynamic hysteresis voltage or the threshold voltage so that an added value of the dynamic hysteresis voltage and the threshold voltage becomes a constant value which will not exceed the predetermined level described above. In this case, it is particularly effective to arrange the comparison reference level limiting means as what attenuates the crest value of the dynamic hysteresis voltage in proportion to the voltage value of the voltage converting signal output from the frequency/voltage converting means.

That is, because the level of the threshold voltage becomes high by itself when the engine rotates at high-speed, the action for masking the ignition noise is sufficiently achieved by the comparison reference signal which is a combined signal of those voltages even when the crest value of the dynamic hysteresis voltage attenuates in proportion to the number of engine revolutions. Furthermore, because the crest value of the dynamic hysteresis voltage attenuates when the engine rotates at high-speed, the input signal level may be reliably detected even when it becomes minimum.

It is also possible to limit the changes of the level of the threshold voltage in proportion to the number of engine revolutions in the manner as described above while keeping the crest value of the dynamic hysteresis voltage as it is.

The comparison reference level limiting means may be arranged further as what cuts the added value of the dynamic hysteresis voltage and the threshold voltage to a certain level on which it will not exceed the predetermined level. By arranging the comparison reference level limiting means as described above, the functions of masking the ignition noise and interference noise superimposed on the input signal and of detecting the minimum level of the input signal may be both satisfied in the mode of each arrangement described above, though an ideal waveform as the comparison reference signal may not be obtained.

BRIEF DESCRIPTION OF THE DRAWINGS

The above and other advantages of the present invention will become more apparent in the following description and the accompanying drawings in which like numerals refer to like parts and in which:

FIGS. 6A and 6B are time charts showing a mode of generating a dynamic hysteresis current by the wave-shaping circuit of the second embodiment;

FIGS. 7A and 7B are time charts showing a mode of generating a comparison reference signal by the wave-shaping circuit of the second embodiment;

FIGS. 8A and 8B are time charts showing an actual condition and a correction mode of the dynamic hysteresis current generated by the wave-shaping circuit of the second embodiment;

FIGS. 17A and 17B are time charts showing a mode of generating a dynamic hysteresis current by the dynamic hysteresis circuit shown in FIG. 14;

FIGS. 18A and 18B are time charts showing a mode of generating primarily a dynamic hysteresis voltage by the prior art wave-shaping circuit;

FIG. 19 is a schematic view showing a mode in which an ignition noise is mixed into an input signal of an electromagnetic pickup;

FIGS. 20A through 20C are time charts showing a mode of masking the ignition noise mixed into and superimposed on the input signal mainly by the dynamic hysteresis voltage;

DETAILED DESCRIPTION OF THE PREFERRED EMBODIMENTS

Preferred embodiments of the present invention will be explained below with reference to the drawings.

Figure 12:
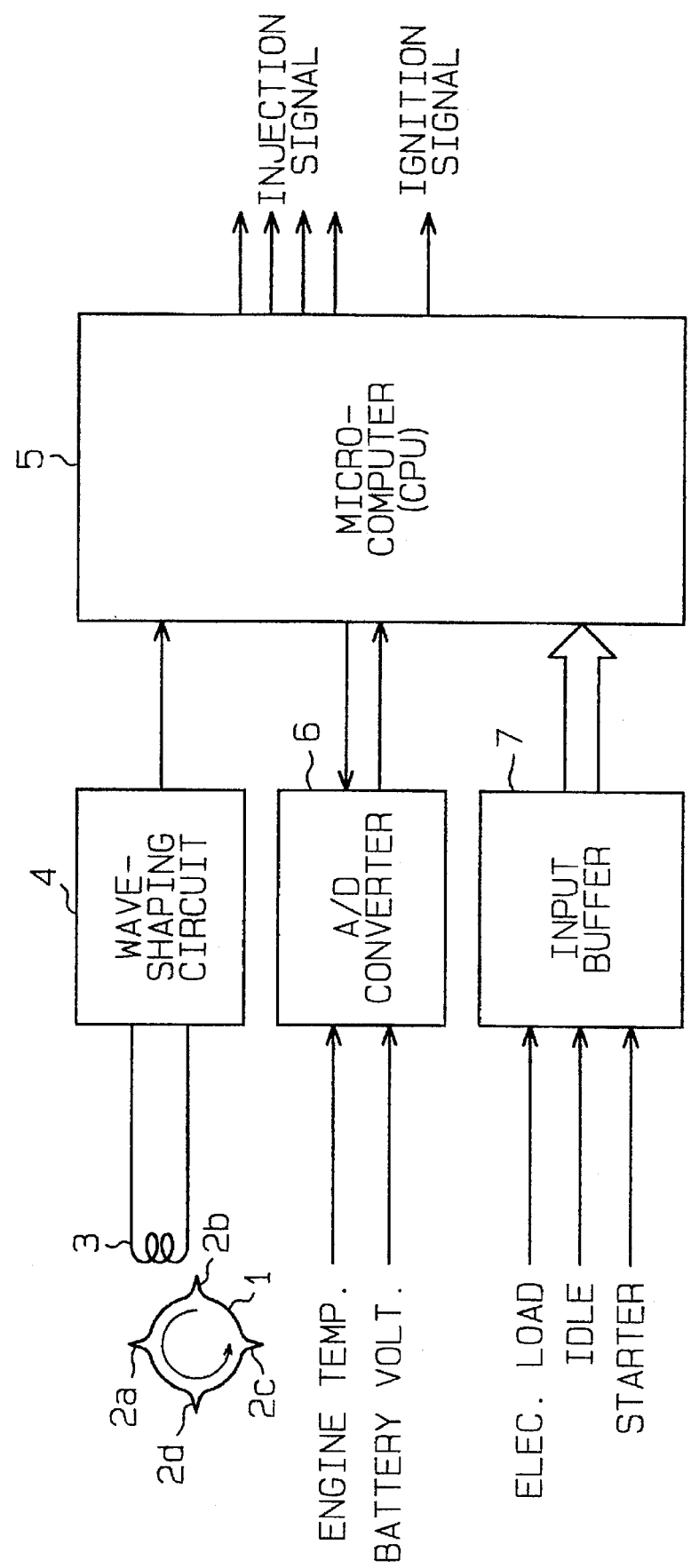
FIG. 12 is a block diagram schematically showing a structure of a prior art electronic control system of a typical engine, assuming a four-cylinder engine.

An arrangement around the wave-shaping circuit as an engine electronic control system is the same as that shown in FIG. 12 described before and an explanation of components thereof which may otherwise overlap will be omitted here for brevity. Further, in the wave-shaping circuit according to the present invention, the same reference numerals refer to like or corresponding parts of the prior art wave-shaping circuit illustrated in FIG. 13 described before and an explanation of those parts which may otherwise overlap will be also omitted here for brevity.

(First Embodiment)

Figure 1:
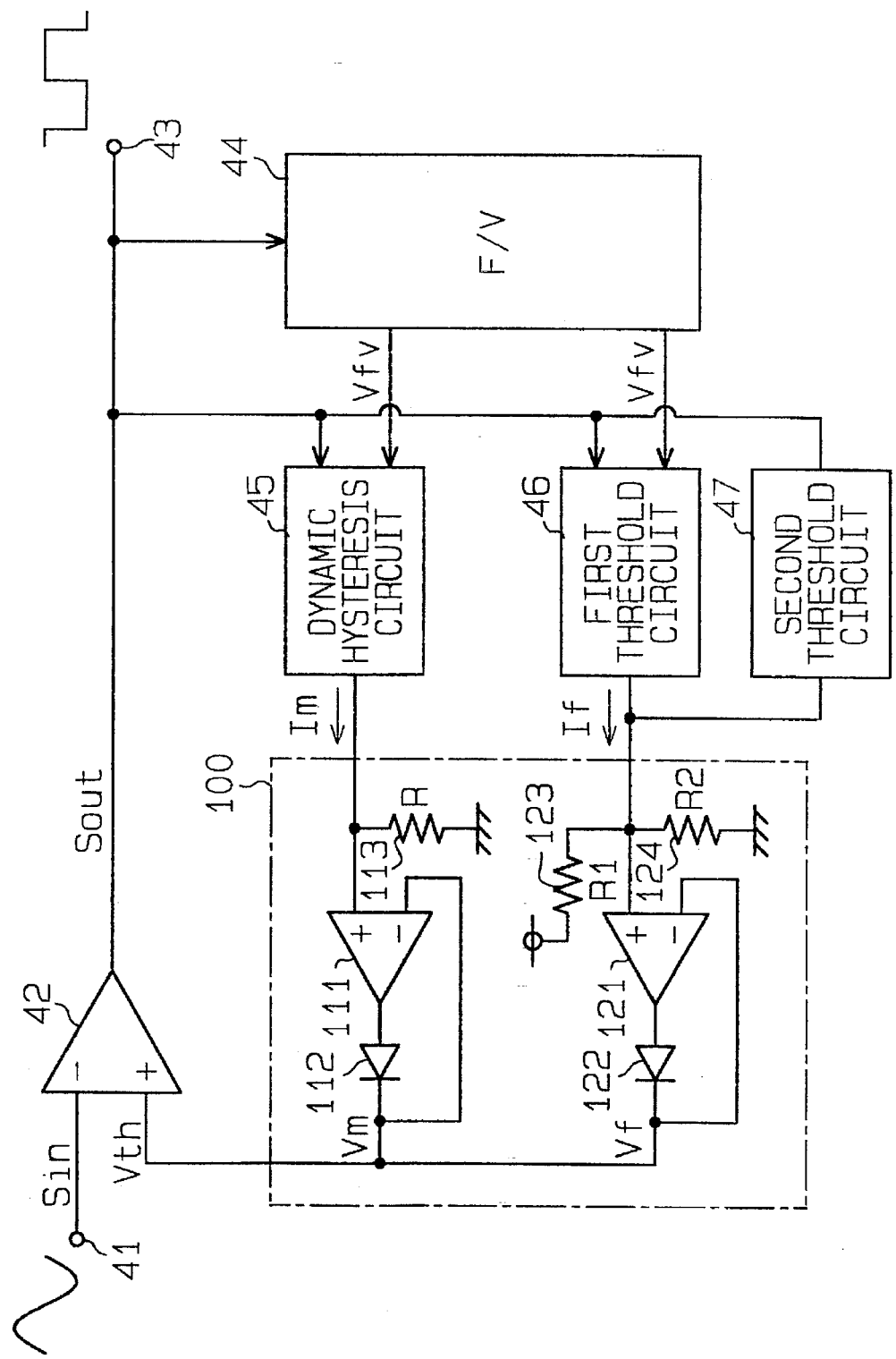
FIG. 1 is a block diagram showing a structure of a first embodiment of a wave-shaping circuit of the present invention.

FIG. 1 shows a first embodiment of a wave-shaping circuit of the present invention. The wave-shaping circuit of the first embodiment is arranged as a circuit for dynamically setting either a dynamic hysteresis voltage or a threshold voltage, whichever is larger, as a comparison reference signal at each time.

In the wave-shaping circuit of the first embodiment, a dynamic hysteresis current Im output from a dynamic hysteresis generating circuit 45 and a threshold current If output from a first threshold generating circuit 46 are both input to a high-level selecting circuit 100.

Figure 22A:
FIGS. 22A and 22B are time charts showing a mode of generating a threshold current by the first threshold generating circuit shown in FIG. 21.
Figure 22B:
Figure 23:
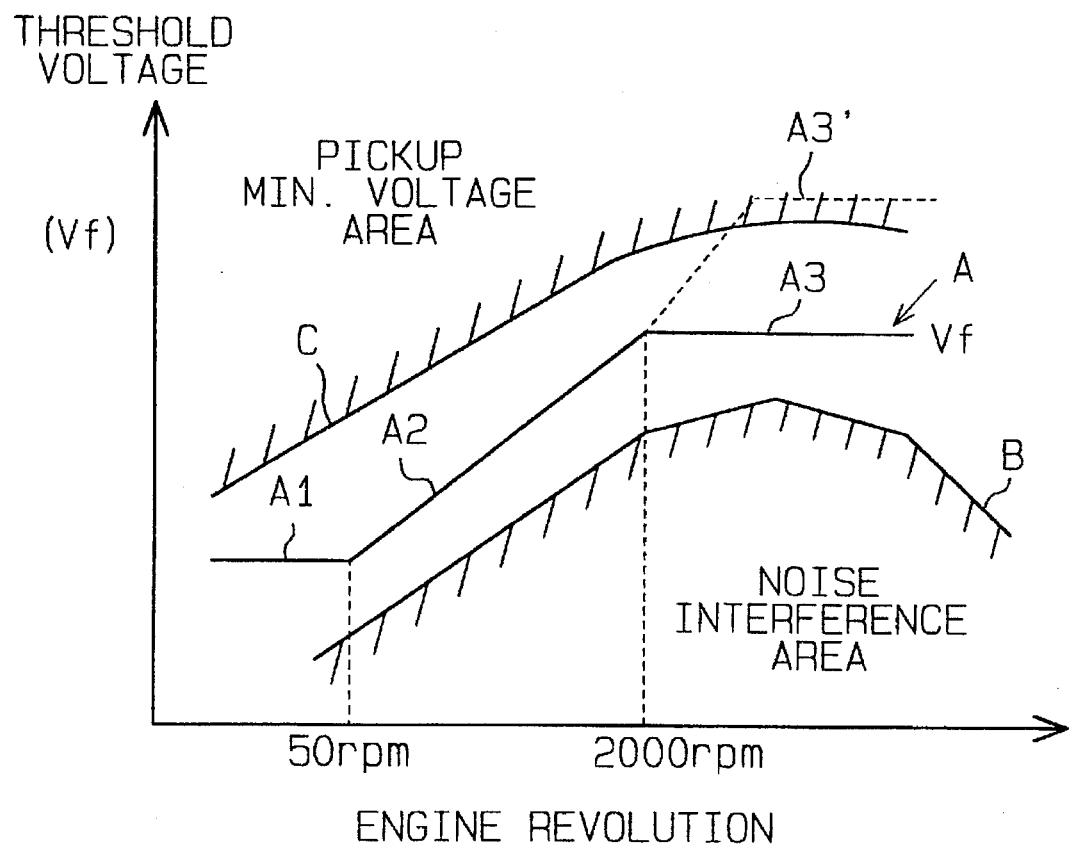
FIG. 23 is a graph showing a standard and mode for setting up the threshold voltage in the wave-shaping circuit.
Figure 24:
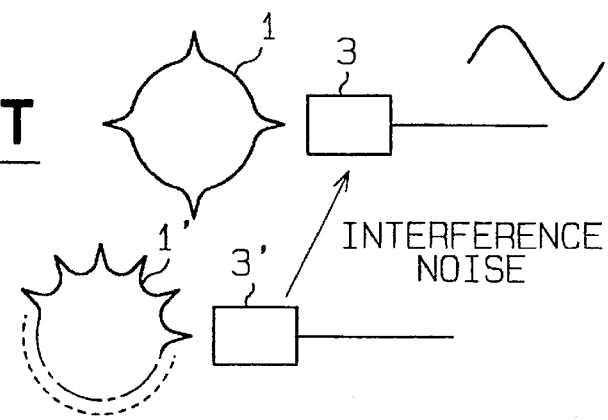
FIG. 24 is a schematic view showing a mode in which an interference noise between electromagnetic pickup is mixed into an input signal thereof.
Figure 25:
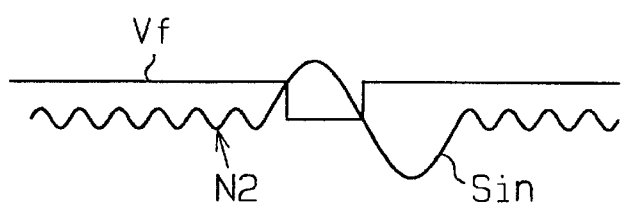
FIG. 25 is a time chart showing a mode of masking the interference noise mixed into and superimposed on the input signal by the threshold voltage.

The dynamic hysteresis current Im is a current whose level attenuates or changes gradually from a certain crest value at a speed proportional to a number of engine revolutions (a voltage converting output Vfv of a F/V (frequency-to-voltage) converting circuit 44) when a wave-shaped signal Sout is at the logic-H level as shown in FIG. 17. A threshold current If is a current which increases and decreases in proportion to the number of engine revolutions between the minimum and maximum values set in advance when the wave-shaped signal Sout is at the logic-H level as shown also in FIG. 22.

The high-level selecting circuit 100 is a circuit for inputting those currents Im and If to generate a dynamic hysteresis voltage Vm and threshold voltage Vf which correspond to these currents respectively and to selectively output either of those voltages, whichever has a higher level, as a comparison reference signal Vth to a comparator 42.

That is, in the high-level selecting circuit 100, a resistor 113 generates the dynamic hysteresis voltage Vm by its resistance R and the dynamic hysteresis current Im. The generated voltage Vm is applied to an operational amplifier 111 constituting a non-inverting amplifier. An output of the operational amplifier 111 is fed back to its inverting input (−terminal) via a diode 112.

In the high-level selecting circuit 100, resistors 123 and 124 generate the threshold voltage Vf by a partial potential value of those resistances R1 and R2 and the threshold current If, and the generated voltage is applied to an operational amplifier 121 similarly constituting a non-inverting amplifier. An output of this operational amplifier 121 is also fed back to its inverting input (−terminal) via a diode 122.

Output terminals of the diodes 112 and 122 are connected in common to a non-inverting input terminal (+terminal) of the comparator 42. Due to that, in the high-level selecting circuit 100, the output of the other operational amplifier is suppressed either by the dynamic hysteresis voltage Vm output via the diode 112 or the threshold voltage Vf output via the diode 122, whichever is larger, and only the larger voltage is applied to the non-inverting input (+terminal) of the comparator 42 as the comparison reference signal Vth.

Figure 2A:
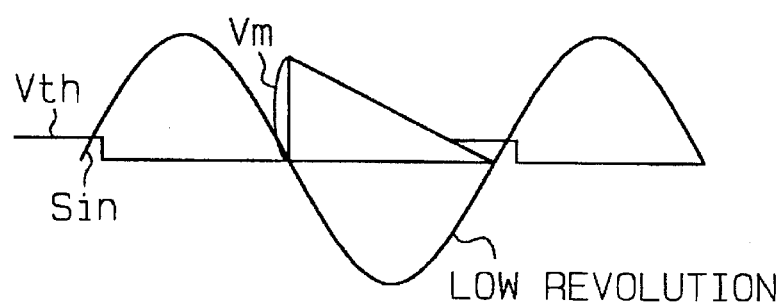
FIGS. 2A and 2B are time charts showing a mode of generating a comparison reference signal by the wave-shaping circuit of the first embodiment.

Because the level of the threshold voltage Vf is set low when the engine rotates at low-speed in the wave-shaping circuit of the first embodiment, the dynamic hysteresis voltage Vm is dominant as the comparison reference signal Vth as shown in FIG. 2A. That is, although the level of the voltage Vm attenuates gradually from a certain crest value, the voltage Vm is selectively output from the high-level selecting circuit 100 in almost all areas until it completely attenuates.

Figure 2B:
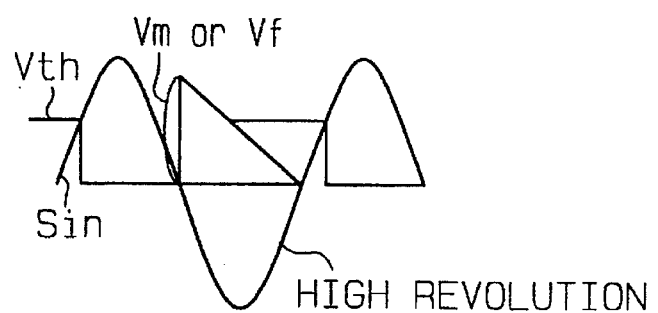

On the other hand, because the level of the threshold voltage Vf is set high when the engine rotates at high-speed as shown in FIG. 2B, although the dynamic hysteresis voltage Vm is dominant as the comparison reference signal Vth in the beginning, the level of the threshold voltage Vf soon surpasses that of the voltage Vm as the voltage Vm attenuates, and the voltage Vf becomes dominant thereafter.

Accordingly, even if the threshold voltage Vf is set in the mode shown in FIG. 2B, no excessive level of signal is applied to the comparator 42 as the comparison reference signal Vth even when the engine rotates at high-speed, provided that the maximum crest value of the dynamic hysteresis voltage Vm set through the dynamic hysteresis generating circuit 45 or the resistor 113 of the high-level selecting circuit 100 is set under the following conditions:

(1) a voltage value which can mask the ignition noise described before; and (2) a voltage value which can detect even a minimum level of the input signal Sin.

As described above, the wave-shaping circuit of the first embodiment assuredly masks the ignition noise of the engine and the interference noise between the pickups even when they are superimposed on the input signal Sin and reliably detect the minimum level of the input signal Sin.

The ignition noise is dominant as the noise component superimposed on the input signal Sin in the beginning of the generation of the comparison reference signal Vth when the dynamic hysteresis voltage Vm is selectively output as the comparison reference signal Vth and the interference noise becomes dominant in the period thereafter when the threshold voltage Vf is selectively output.

Accordingly, each characteristic of the dynamic hysteresis voltage Vm and the threshold voltage Vf as the voltage for masking the noise component is utilized very effectively by the arrangement of the wave-shaping circuit of the first embodiment described above.

(Second Embodiment)

Figure 3:
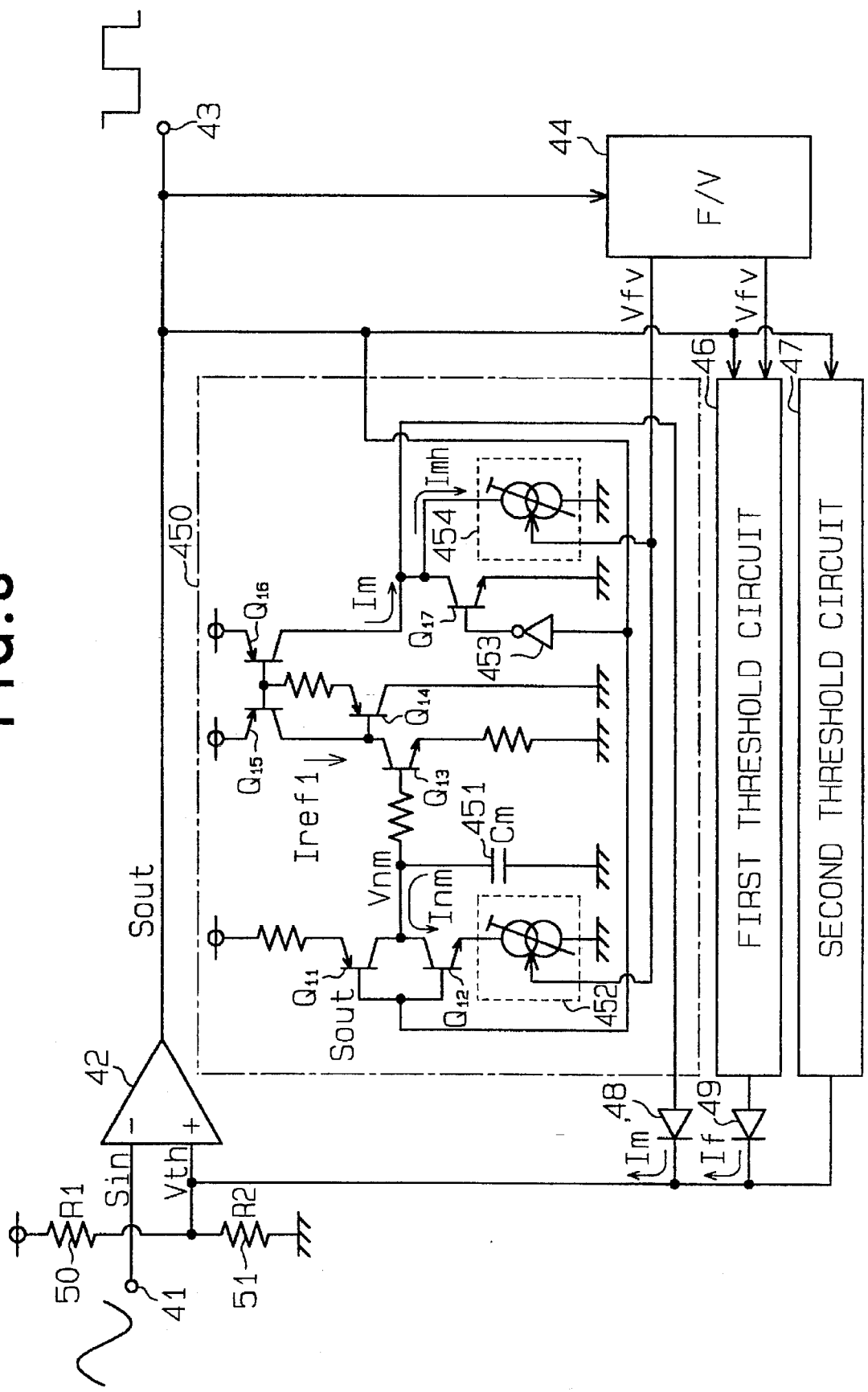
FIG. 3 is a block diagram showing a structure of a second embodiment of the wave-shaping circuit of the present invention.

FIG. 3 shows a second embodiment of the wave-shaping circuit of the present invention.

Figure 4:
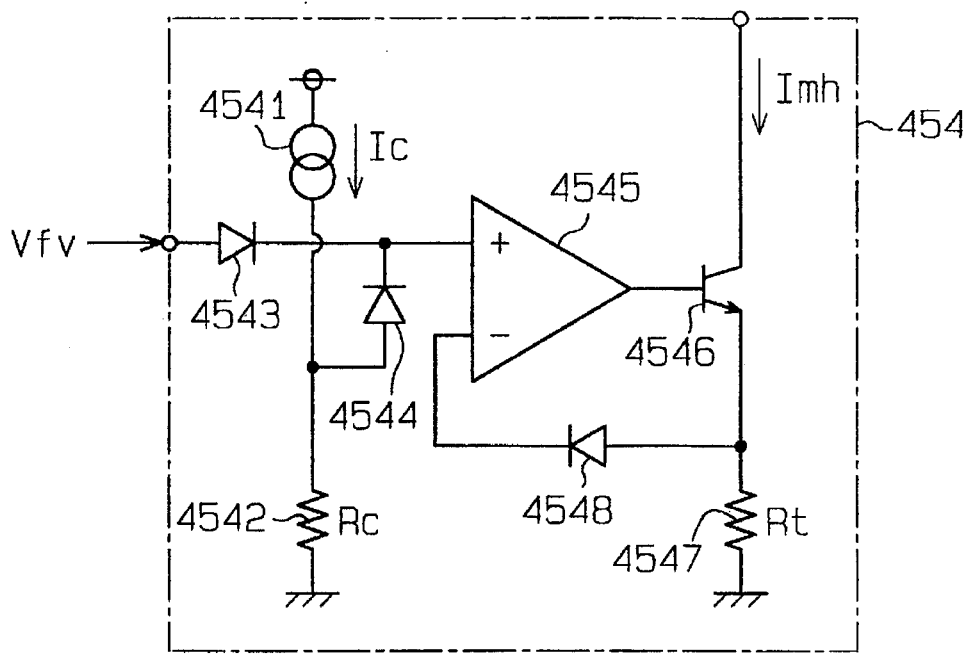
FIG. 4 is a circuit diagram showing one example of a current offsetting circuit shown in FIG. 3.

In the wave-shaping circuit of the second embodiment, a crest value varying dynamic hysteresis generating circuit 450 comprises a current offsetting circuit 454 for offsetting the dynamic hysteresis current Im generated as described before in proportion to the number of engine revolutions, i.e., the voltage converting signal Vfv. FIG. 4 shows a concrete example of the current offsetting circuit 454.

As shown in FIG. 4, the current offsetting circuit 454 comprises a constant-current source 4541, a resistor 4542, diodes 4543 and 4544 for adding voltages, a non-inverting amplifier 4545, a transistor 4546, a load resistor 4547 and a feedback diode 4548.

Figure 5:
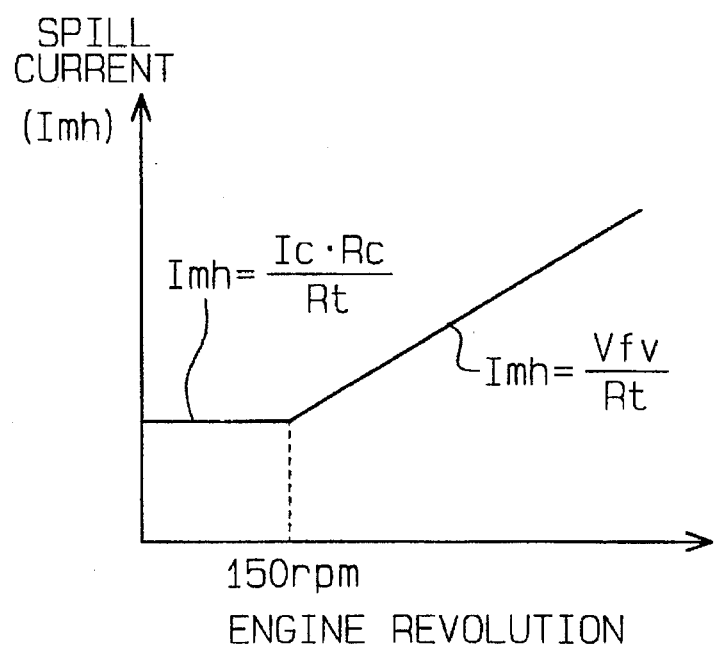
FIG. 5 is a graph showing a current spilling characteristic of the current spilling circuit.

In the current offsetting circuit 454, a constant voltage (Ic×Rc) defined by the constant-current source 4541 and the resistor 4542 is applied to the load resistor 4547 until the voltage converting signal Vfv reaches a voltage which corresponds to 150 rpm as shown in FIG. 5, for example. That is, a offset current Imh becomes a constant current which is expressed as follows:

$$Imh = Ic \times Rc/Rt$$

However, when the voltage converting signal Vfv exceeds the voltage which corresponds to 150 rpm for example, the voltage value of the voltage converting signal Vfv becomes dominant in the voltage applied to the load resistor 4547 and the flow amount of the offset current Imh also increases in proportion to the voltage value of the voltage converting signal Vfv as shown in FIG. 5 in a mode expressed as follows:

$$Imh = Vfv/Rt$$

That is, the quantity of offset increases in proportion to the number of engine revolutions.

Because the dynamic hysteresis current Im is thus offset by the current offsetting circuit 454, the crest value of a current Im' which is output from the crest value varying dynamic hysteresis generating circuit 450 via a diode 48 attenuates in proportion to the number of engine revolutions as shown in FIGS. 6A and 6B.

Then, because the crest value of the dynamic hysteresis current Im attenuates in proportion to the number of engine revolutions as described above, the comparison reference signal Vth generated based on a current to which its residual current Im' and the threshold current If are added is generated also in a manner shown in FIGS. 7A and 7B.

Figure 26A:
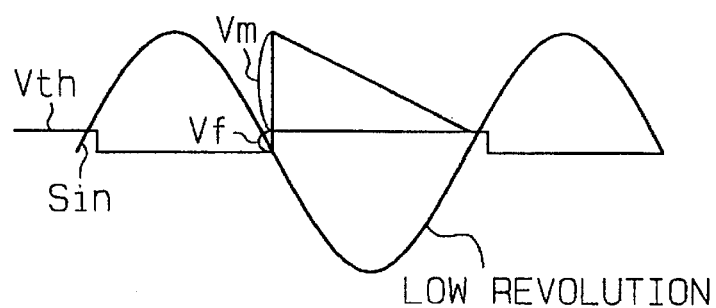
FIGS. 26A and 26B are time charts showing a mode of generating a comparison reference signal by the prior art wave-shaping circuit.
Figure 26B:
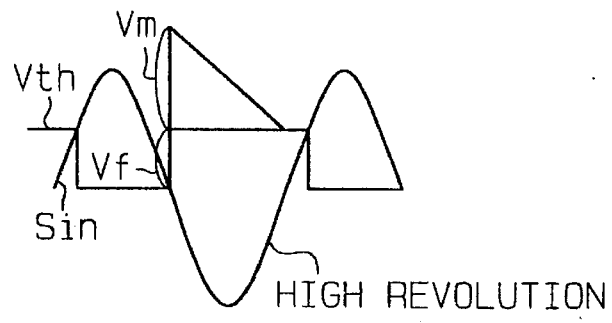

That is, when the engine rotates at low-speed, the comparison reference signal Vth is generated almost in the same manner as the prior art wave-shaping circuit as shown in FIG. 7A because the crest value of the dynamic hysteresis voltage Vm attenuates less (see FIG. 26A).

When the engine rotates at high-speed on the other hand, although the level of the threshold voltage Vf increases, the crest value of the dynamic hysteresis voltage Vm is largely attenuated and the comparison reference signal Vth which is a signal to which they are added and combined is limited to a preferable level in a manner shown in FIG. 7B. The maximum value of the comparison reference signal Vth shown in FIG. 7B shall be set though the current offsetting circuit 454 at a value satisfying the following conditions:

(1) a voltage value which can mask the ignition noise described before; and (2) a voltage value which can detect even a minimum level of the input signal Sin.

Due to that, no excessive level of signal is applied to the comparator 42 as the comparison reference signal Vth even when the engine rotates at high-speed also by the wave-shaping circuit of the second embodiment. Then, it assuredly masks the ignition noise of the engine and the interference noise between the pickups even when they are superimposed on the input signal Sin and reliably detects even the minimum level of the input signal Sin.

Since the attenuation speed of the current Im is controlled through the discharge control circuit 452, its mask time Tm is also shortened in proportion to the number of engine revolutions in the arrangement of the wave-shaping circuit of the second embodiment shown in FIG. 3. Accordingly, the crest value and mask time of the current Im' are shortened when the engine rotates at high-speed as compared with the time when the engine rotates at low-speed as shown in FIGS. 8A and 8B. Although there is no particular problem with that, it may be corrected in a manner as shown by a broken line in FIG. 8B by changing the discharge characteristic of the discharge control circuit 452 for example.

Further, although the wave-shaping circuit of the second embodiment has been arranged so as to attenuate the crest value of the dynamic hysteresis voltage Vm in proportion to the number of engine revolutions, it is also possible to arrange it so as to limit the threshold voltage Vf in accordance with the number of engine revolutions for example.

(Third Embodiment)

Figure 9:
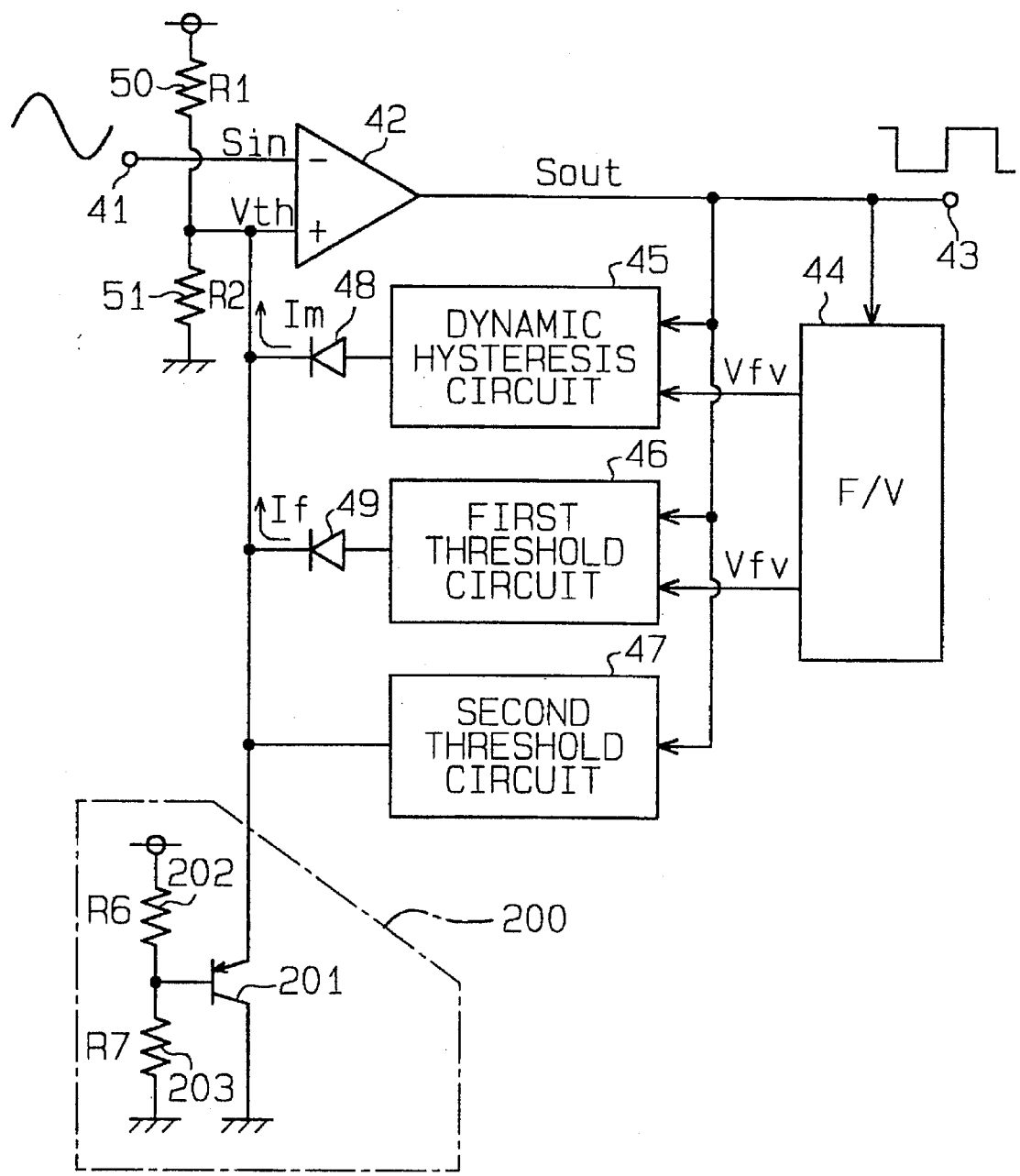
FIG. 9 is a block diagram showing a structure of a third embodiment of the wave-shaping circuit of the present invention.

FIG. 9 shows a third embodiment of the wave-shaping circuit of the present invention.

The wave-shaping circuit of the third embodiment is arranged as a circuit for generating the comparison reference signal by adding and combining the dynamic hysteresis voltage and the threshold voltage and for cutting the added value at a certain level.

Figure 13:
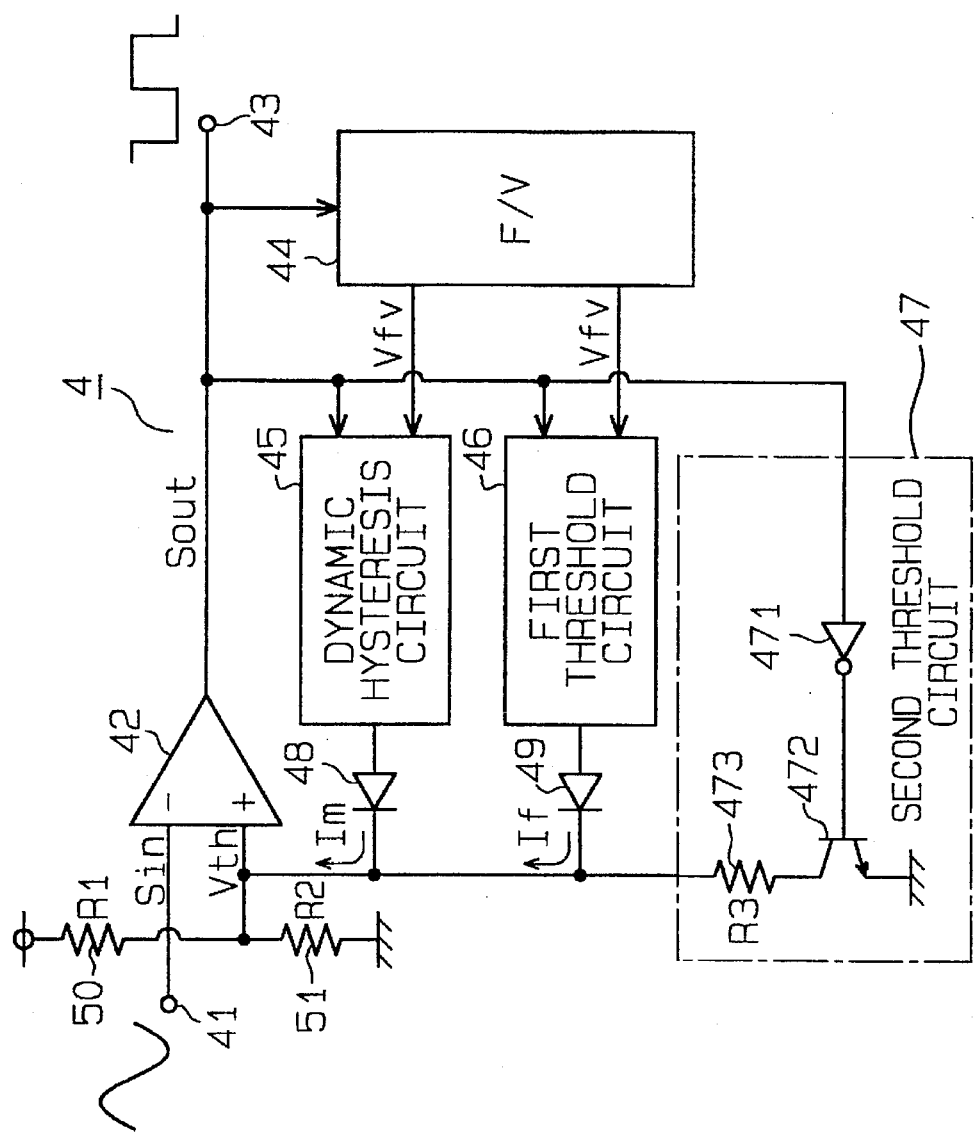
FIG. 13 is a block diagram showing a structural example of a prior art wave-shaping circuit adopted in the electronic control system in FIG. 12.
Figure 14:
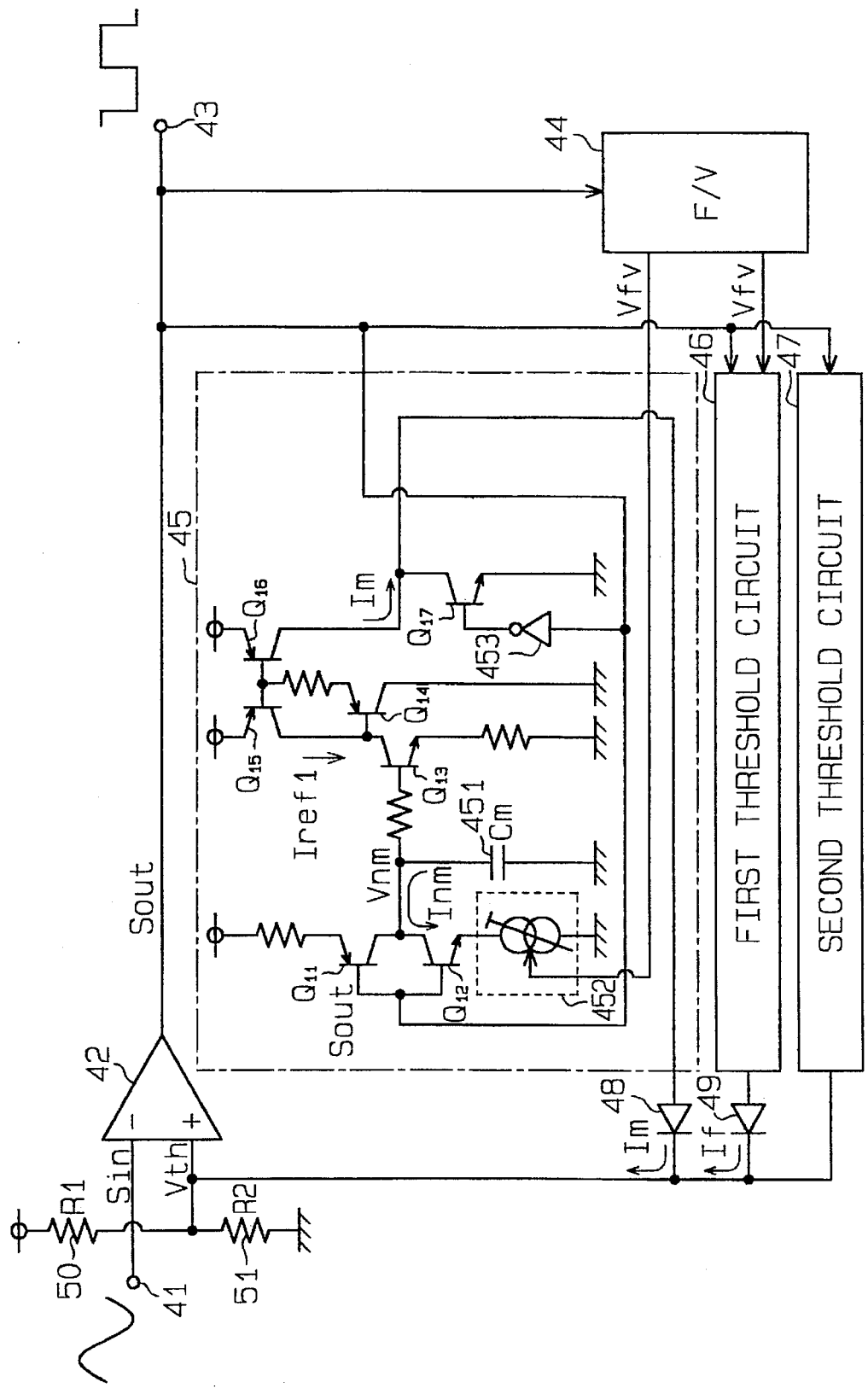
FIG. 14 is a circuit diagram showing a concrete example of a dynamic hysteresis generating circuit shown in FIG. 13.
Figure 15:
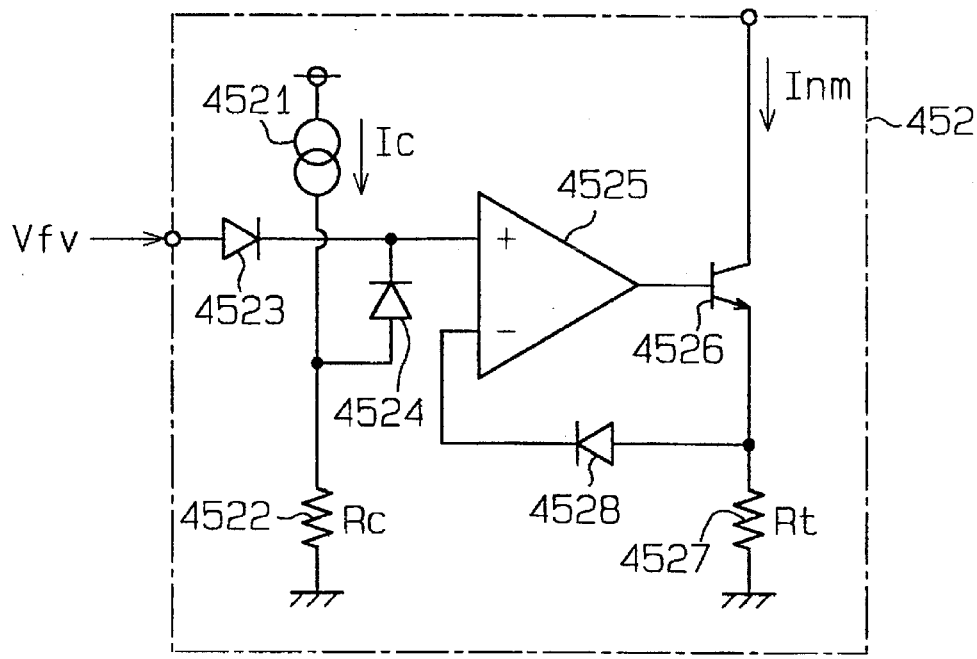
FIG. 15 is a circuit diagram showing one example of a discharge control circuit shown in FIG. 14.
Figure 16:
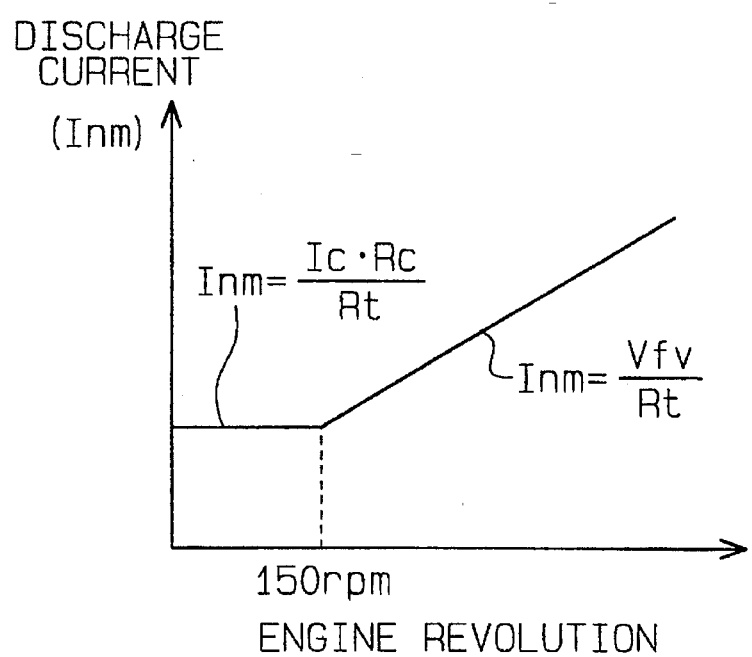
FIG. 16 is a graph showing a current discharge characteristic of the discharge control circuit.
Figure 21:
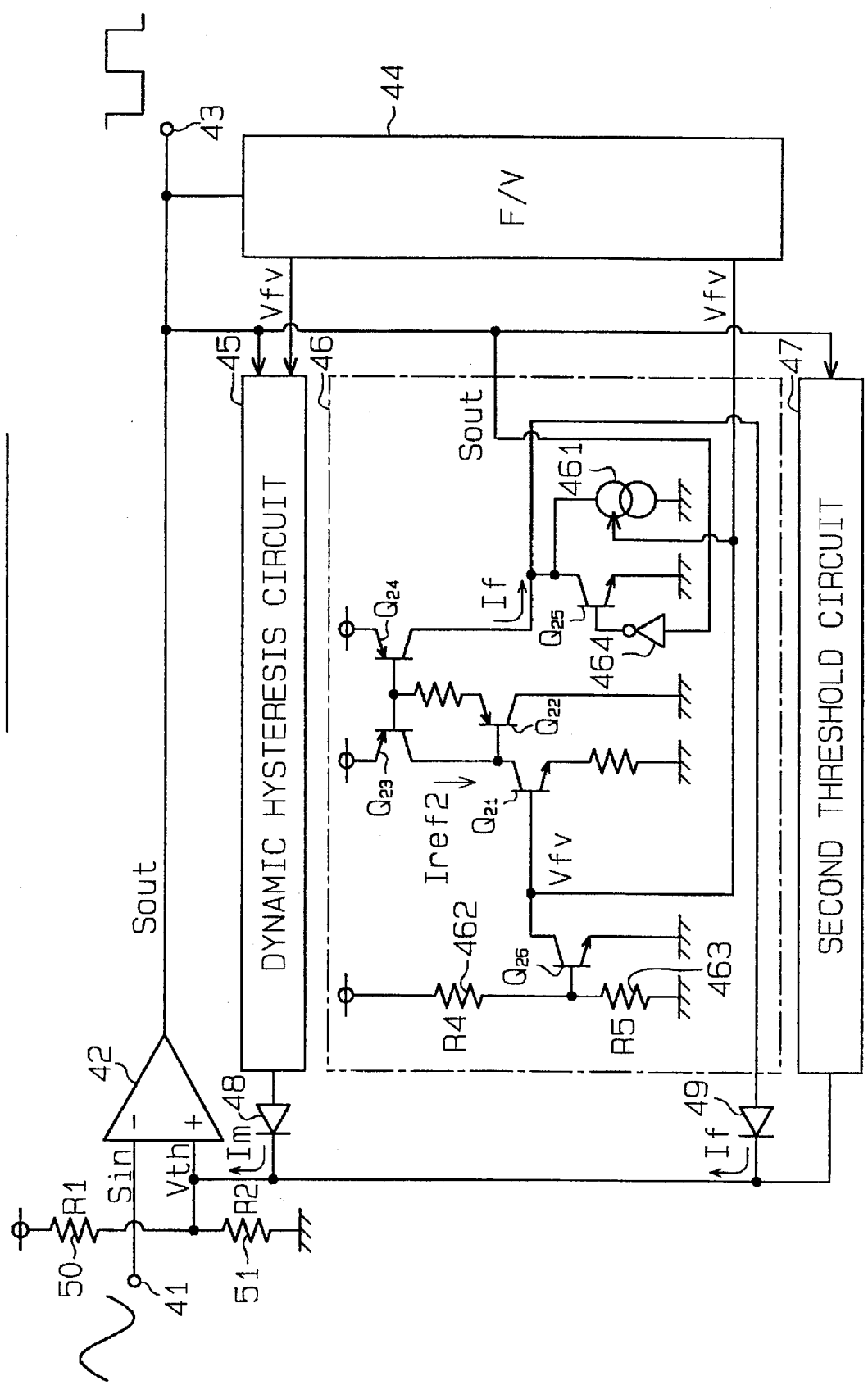
FIG. 21 is a circuit diagram showing a detailed example of a first threshold generating circuit shown in FIG. 13.

As shown in FIG. 9, the wave-shaping circuit of the third embodiment comprises an added value limiting circuit 200, in addition to the components shown in FIG. 13.

This added value limiting circuit 200 is a circuit in which a transistor 201 turns on when a level of the comparison reference signal Vth applied to the non-inverting input (+terminal) of the comparator 42 exceeds a partial potential value of a potential dividing circuit composed of resistors 202 and 203 to limit (cut) the level of the comparison reference signal Vth to the partial potential value.

Figure 10A:
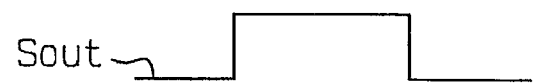
FIGS. 10A and 10B are time charts showing a mode of adding the dynamic hysteresis current and a threshold current by the wave-shaping circuit of the third embodiment.
Figure 10B:
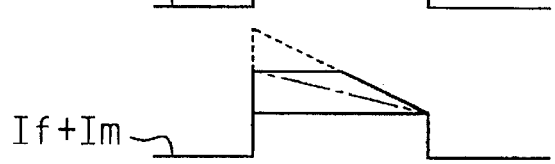

Due to that, according to the wave-shaping circuit of the third embodiment, although the threshold current If increases and decreases in proportion to the number of engine revolutions, part of a voltage which is equivalent to the added value of the current If and the dynamic hysteresis current Im is cut when it exceeds the partial potential value as shown in FIGS. 10A and 10B.

Figure 11A:
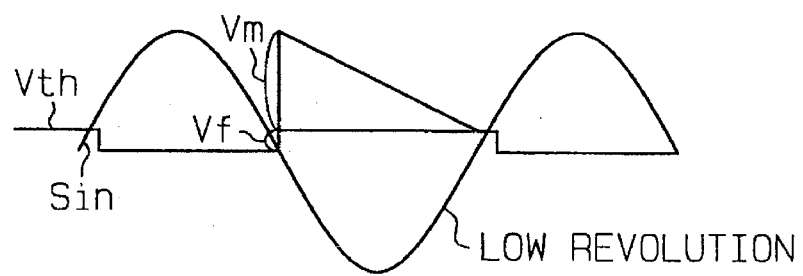
FIGS. 11A and 11B are time charts showing a mode of generating a comparison reference signal by the wave-shaping circuit of the third embodiment.
Figure 11B:
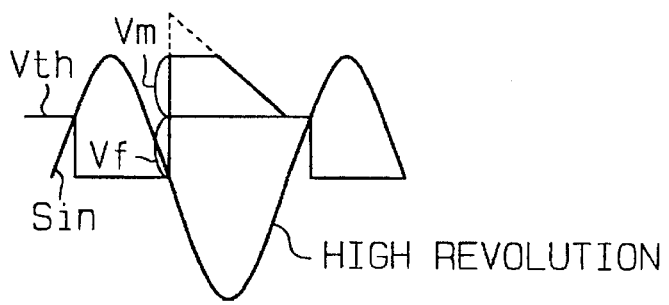

Then, due to such cut, the comparison reference signal Vth which is generated on the basis of the added value of such threshold current If and the dynamic hysteresis current Im is generated in a manner as shown in FIGS. 11A and 11B.

That is, when the engine rotates at low-speed, the level of the comparison reference signal Vth will not exceed the partial potential value because the threshold voltage Vf is also generated as a voltage having a low level from the beginning and the comparison reference signal Vth is generated in almost the same manner as in the prior art wave-shaping circuit as shown in FIG. 11A (see FIG. 26A).

When the engine rotates at high-speed on the other hand, although the level of the threshold voltage Vf increases and hence the level of the comparison reference signal Vth is also inclined to increase accordingly, the added value limiting circuit 200 acts when the level exceeds the partial potential value and the part of the voltage exceeding the partial potential is cut in a manner as shown in FIG. 11B after all. The partial potential value of the potential dividing circuit composed of the resistors 202 and 203 shall be set through the resistance values R6 and R7 of those resistors also at a value satisfying the following conditions:

(1) a voltage value which can mask the ignition noise described before; and (2) a voltage value which can detect even a minimum level of the input signal Sin.

Due to that, no excessive level of signal is applied to the comparator 42 as the comparison reference signal Vth even when the engine rotates at high-speed also by the wave-shaping circuit of the third embodiment. It also assuredly mask the ignition noise of the engine and the interference noise between the pickups even when they are superimposed on the input signal Sin and reliably detects the minimum level of the input signal Sin.

The arrangement of the wave-shaping circuit of the third embodiment realizes a steady mask having a long monitoring period especially for the ignition noise, though an ideal waveform as shown by a dashed line in FIG. 10B cannot be obtained when the engine rotates at high-speed.

The noise superimposed on the input signal Sin has been the ignition noise or interference noise and the dynamic hysteresis voltage Vm and the threshold voltage Vf have been generated as voltages for masking such noise in any of the first through third embodiments described above. However, the noise to be masked may be any kind of noise and the masking voltages to be generated are not limited only to the dynamic hysteresis voltage Vm and threshold voltage Vf. That is, if there is a noise which may be superimposed other than those, it is possible to generate a masking voltage separately for such noise and the comparison reference signal Vth may be generated as a combined signal of more than three such masking voltages.

In short, the wave-shaping circuit of the present invention may be modified to comprise, in addition to the comparator and the frequency/voltage converting circuit;

masking signal generating means for generating at least two masking signals for masking various noise components superimposed on the input signal on the basis of the voltage converting signal output from the frequency/voltage converting circuit;

comparison reference signal generating means for dynamically generating the comparison reference signal of the comparator as a combined signal based on such generated masking signals; and comparison reference level limiting means for limiting a signal level of the comparison reference signal generated as a combined signal of the masking signals so that it will not exceed a predetermined level.

As described above, the wave-shaping circuit of the present invention sets the comparison reference signal for binarizing an input signal input as an alternating analog signal synchronized with a number of engine revolutions always at an appropriate signal level regardless of the number of engine revolutions. Due to that, it realizes an accurate binarizing process at any time.

While the described embodiments represent the preferred forms of the present invention, it is to be understood that modifications will occur to those skilled in that art without departing from the spirit of the invention. The scope of the invention is therefore to be determined solely by the appended claims.

What is claimed is:

1. A wave-shaping circuit for an alternating analog output signal from a sensor which detects rotation speed of an engine, said wave-shaping circuit comprising:
   a comparator for comparing said alternating analog output signal with a comparison reference signal to provide a binary signal corresponding to said alternating analog output signal;
   frequency/voltage converting means for converting said binary signal to a voltage conversion signal which has a voltage value corresponding to a frequency of said binary signal:
   dynamic hysteresis voltage generating means for generating a dynamic hysteresis voltage responsive to said voltage conversion signal, said dynamic hysteresis voltage having a crest value and gradually decreasing over a time interval from said crest value;
   threshold voltage generating means for receiving said voltage conversion signal and generating a threshold voltage whose voltage level changes in proportion to said voltage conversion signal; and
   higher signal selecting means for selecting a higher one of said dynamic hysteresis voltage and said threshold voltage and providing said selected higher voltage to said comparator as said comparison reference signal.

2. A wave-shaping circuit according to claim 1, wherein:
   said dynamic hysteresis voltage gradually decreases from said crest value at a rate corresponding to voltage value of said voltage conversion signal.

3. A wave-shaping circuit according to claim 1, wherein:
   said threshold voltage is maintained between a predetermined maximum value and a predetermined minimum value.

4. A wave-shaping circuit according to claim 1, wherein:
   said higher signal selecting means provides said selected higher voltage to said comparator as said comparison reference signal when a value of said alternating analog output signal from said sensor is lower than said comparison reference signal.

5. A wave-shaping circuit for an alternating analog output signal from a sensor which detects rotation speed of an engine, said wave-shaping circuit comprising:
   a comparator for comparing said alternating analog output signal with a comparison reference signal to provide a binary signal corresponding to said alternating analog output signal;
   frequency/voltage converting means for converting said binary signal to a voltage conversion signal which has a voltage value corresponding to a frequency of said binary signal:
   dynamic hysteresis voltage generating means for generating a dynamic hysteresis voltage responsive to said voltage conversion signal, said dynamic hysteresis voltage having a crest value and gradually decreasing over a time interval from said crest value;
   threshold current generating means for receiving said voltage conversion signal and generating a threshold current whose current level changes in said voltage conversion signal; and
   higher signal selecting means for generating a dynamic hysteresis voltage and a threshold voltage from said dynamic hysteresis current and said threshold current, respectively, for selecting a higher one of said dynamic hysteresis voltage and said threshold voltage, and for providing said selected higher voltage to said comparator as said comparison reference signal.

6. A wave-shaping circuit according to claim 5, wherein:
   said dynamic hysteresis current gradually decreases from said crest value at a rate corresponding to said voltage value of a voltage conversion signal.

7. A wave-shaping circuit according to claim 5, wherein:
   said threshold current is maintained between a predetermined maximum value and a predetermined minimum value.

8. A wave-shaping circuit according to claim 5, wherein:
   said higher signal selecting means provides said selected higher voltage to said comparator as said comparison reference signal when a value of said alternating analog output signal from said sensor is lower than said comparison reference signal.

* * * * *